United States Patent
Stenson et al.

(10) Patent No.: US 9,817,087 B2
(45) Date of Patent: Nov. 14, 2017

(54) SENSOR WITH MAGNETROESITIVE AND/OR THIN FILM ELEMENT ABUTTING SHORTING BARS AND A METHOD OF MANUFACTURE THEREOF

(75) Inventors: Bernard Stenson, Limerick (IE); Stephen O'Brien, Limerick (IE); Matthew Thomas Canty, Limerick (IE)

(73) Assignee: Analog Devices, Inc., Norwood, MA (US)

(*) Notice: Subject to any disclaimer, the term of this patent is extended or adjusted under 35 U.S.C. 154(b) by 981 days.

(21) Appl. No.: 13/420,389

(22) Filed: Mar. 14, 2012

(65) Prior Publication Data

US 2013/0241543 A1 Sep. 19, 2013

(51) Int. Cl.
*G01R 33/09* (2006.01)
*G01R 33/00* (2006.01)

(52) U.S. Cl.
CPC ....... *G01R 33/096* (2013.01); *G01R 33/0052* (2013.01); *Y10T 29/49117* (2015.01)

(58) Field of Classification Search
CPC ...... G01R 33/06; G01R 33/09; G01R 33/091; G01R 33/093; G01R 33/095; G01R 33/096; G01R 33/098; G01R 33/0052; H01L 43/00; H01L 43/08; H01L 43/12
See application file for complete search history.

(56) References Cited

U.S. PATENT DOCUMENTS

| | | | |
|---|---|---|---|
| 4,334,951 A | 6/1982 | Wagner | |
| 6,413,788 B1 | 7/2002 | Tuttle | |
| 6,424,561 B1 | 7/2002 | Li et al. | |
| 6,850,057 B2 | 2/2005 | Witcraft et al. | |
| 6,868,733 B2 | 3/2005 | Ikezawa et al. | |
| 6,917,087 B2 | 7/2005 | Chen | |
| 7,872,564 B2 | 1/2011 | Zimmer et al. | |
| 2003/0094944 A1* | 5/2003 | Suzuki et al. | 324/252 |
| 2008/0100289 A1 | 5/2008 | Zimmer et al. | |
| 2010/0327864 A1* | 12/2010 | Vigna et al. | 324/252 |

(Continued)

FOREIGN PATENT DOCUMENTS

EP 0738896 10/1996
JP 62-137713 6/1987

(Continued)

OTHER PUBLICATIONS

International Search Report and Written Opinion of Jun. 19, 2013 for International Application No. PCT/US2013/027642, filed Feb. 25, 2013. 11 Pages.

(Continued)

*Primary Examiner* — David M. Schindler
(74) *Attorney, Agent, or Firm* — Knobbe, Martens, Olson & Bear, LLP

(57) ABSTRACT

A method of manufacture of a sensor, the method comprising, in a first fabrication facility, forming one or more components of the sensor on a substrate; and in a second fabrication facility depositing a sensor layer, such as a magnetoresistive sensor, onto the substrate or over the one or more components. Otherwise contaminating effects of depositing magnetoresistive materials can thus be confined to the second fabrication facility, permitting more advanced fabrication equipment and techniques to be employed in the first fabrication facility.

17 Claims, 16 Drawing Sheets

(56) References Cited

U.S. PATENT DOCUMENTS

| | | | |
|---|---|---|---|
| 2011/0163746 A1 | 7/2011 | Zimmer et al. | |
| 2011/0187361 A1* | 8/2011 | Vanhelmont et al. | 324/252 |
| 2012/0161759 A1* | 6/2012 | Pozzati et al. | 324/252 |
| 2012/0212218 A1* | 8/2012 | Fu et al. | 324/252 |
| 2013/0082697 A1* | 4/2013 | Fu et al. | 324/252 |

FOREIGN PATENT DOCUMENTS

| | | |
|---|---|---|
| JP | 03-219682 | 9/1991 |
| JP | 2006-267120 | 5/2006 |
| JP | 2008-96358 | 4/2008 |
| JP | 2008-166633 | 7/2008 |
| KR | 20040075719 | 8/2004 |
| KR | 10-0591390 | 6/2006 |
| TW | 200633188 A | 9/2006 |
| TW | 200901175 A | 1/2009 |

OTHER PUBLICATIONS

Office Action in corresponding Japanese Patent Application No. 2014-558926, mailed Aug. 12, 2015.
Office Action in Japanese App. No. 2014-558926 mailed May 6, 2016, 5 pages and 7 page translation.
Extended European Search Report in European Patent App. No. 13761781.7 dated Dec. 22, 2015, 11 pages.
Official Letter and Search Report in Taiwanese Application No. 102106809 dated Sep. 21, 2016, 6 pages and English translation thereof, 5 pages.

* cited by examiner

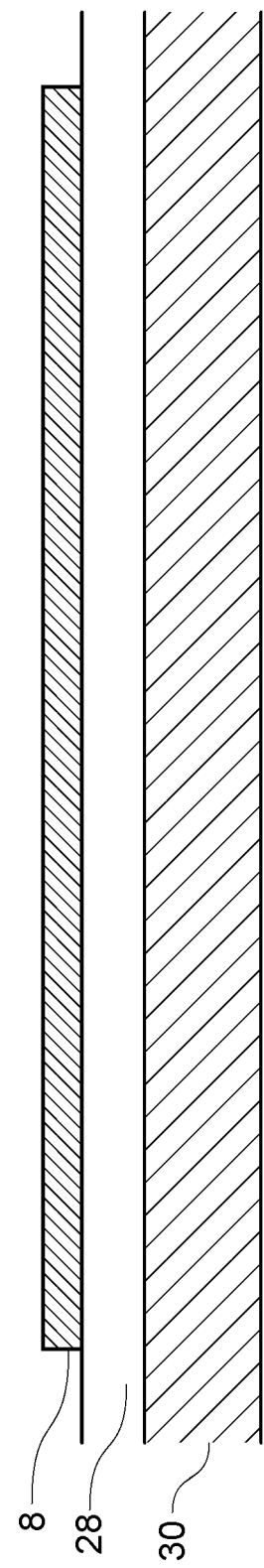

SENSOR WITH MAGNETORESITIVE AND/OR THIN FILM ELEMENT ABUTTING SHORTING BARS AND A METHOD OF MANUFACTURE THEREOF

TECHNICAL FIELD

The present disclosure relates to sensors, such as magnetoresistive sensors, temperature sensors, and infrared detectors, and the manufacture of sensors.

DESCRIPTION OF THE RELATED TECHNOLOGY

During manufacture of a known type of sensor, such as anisotropic magnetoresistive (AMR) sensors, a thin film of a magnetoresistive material such as Permalloy is deposited on a semiconductor substrate. A plurality of conducting strips (commonly known as shorting bars or barber poles) are then be formed over the magnetoresistive material to modify its response to a magnetic field, for example, to set the magnetoresistive material to a bias point such that the sensor is responsive to the direction of an external magnetic field. Similarly, connections to the magnetoresistive material are formed over the magnetoresistive material.

A problem with such a process is that the constituents of Permalloy—Nickel and Iron—can be undesirable in semiconductor fabrication. For many fabrication processes Nickel and Iron are contaminants, which can adversely alter the electrical properties of semiconductor materials. Permalloy can contaminate fabrication tools, rendering them unusable for use in any other process. Furthermore, such contaminants can spread to other tools affecting the outcome of processes throughout the fabrication facility, such as the fabrication of unrelated integrated circuits. Moreover, fabrication facilities and machinery for manufacturing integrated circuits are expensive. Accordingly, owners of multipurpose facilities rarely allow the introduction or use of such contaminating metals.

To overcome these issues, special magnetoresistive sensor specific fabrication facilities can be built, so called 'dirty fabs', in order to keep nickel and iron contaminants away from the environment used for manufacturing other integrated circuits. These dedicated fabrication facilities are expensive to build and are rarely replaced or updated since the expense of doing so often outweighs the income from magnetoresistive sensors. As a result, facilities used for the fabrication of such sensors often used outdated equipment, which in turn may result in feature sizes and component placements within the sensor that are not as good as is available in contemporary manufacturing facilities. Consequently, device performance, when dependent on feature size, may be degraded.

Irrespective of whether the metallic or alloy layer that forms the sensor is contaminating, connecting to such a layer can be problematic.

SUMMARY OF CERTAIN INVENTIVE ASPECTS

According to a first aspect of the disclosure there is provided a magnetoresistive sensor comprising:
a substrate;
a plurality of shorting bars; and
at least one magnetoresistive element formed over the substrate and the plurality of shorting bars, and in abutting and electrical contact with the shorting bars.

Since, according to the first aspect, the magnetoresistive element is deposited directly on top of, and in electrical contact with, the shorting bars, all process steps preceding deposition of the magnetoresistive element can be performed in a first fabrication facility that is not exposed to the contaminating material of the magnetoresistive element. This first fabrication facility can be notionally regarded as being a "clean" facility. The process steps preceding the deposition of the magnetoresistive layer may include the formation of transistors, integrated circuits, and interconnecting conductors using processes such as patterning, etching, doping and thermal diffusion or any other process known for manufacturing semiconductor devices. The deposition of the magnetoresistive element can be performed in a second, possibly dedicated, facility after the majority of the processing steps for fabrication of the sensor have been completed. This facility can be regarded as being "dirty" as it handles materials that normally a fabrication owner would not wish to use within their facility. As a consequence integrated circuits may be fabricated on the same semiconductor wafer as the sensor. This means that transistors, metallic connectors and the shorting bars can be defined using processing steps available in contemporary manufacturing facilities, offering better control of feature size and resolution of components, which in turn may offer improved performance. For example, more accurate control of the positioning of the shorting bars gives improved sensor performance in terms of sensitivity (e.g., thinner bars can improve sensor sensitivity) and linearity.

The shorting bars may be formed by forming a trench in a dielectric material (or at least a material whose resistance is significantly greater than that of the magnetoresistive element, so lightly doped or undoped semiconductor may also fulfill this role), depositing metal in and around the trench, and then etching and/or mechanically removing the uppermost portions of the metal, such as by using planarization or polishing techniques, so that the shorting bars are defined by the shape of the trench. Such a process can be advantageous, since the formation of the trench in the dielectric can generally be done with higher precision than forming the shorting bars by a patterned wet etch of the metal alone. It thus follows that, in these embodiments, the shorting bars are electrically isolated from all other components until the magnetoresistive element is deposited over them.

The magnetoresistive element may be a single layer of material such as Permalloy. Alternatively, the magnetoresistive layer may be made of other magnetoresistive materials. However the invention is not limited to single layer or single material. Thus, for example, other structures such as tri-layer structures may be formed as the sensor layer. For example, a Fe/Cr/Fe tri-layer structure exhibits giant magnetoresistance.

The high temperature diffusion and annealing steps used in the production of integrated circuits tend to adversely affect the quality of Permalloy and its direction of magnetization. When the semiconductor devices are fabricated before deposition of the magnetoresistive element, the magnetoresistive material need not be subjected to extraneous high temperature processing steps.

According to certain embodiments, a first conductor connects a first end of the magnetoresistive element to a first electrical node and a second conductor connects a second end of the magnetoresistive element to a second electrical node. At least one shorting bar can be disposed between the first and second conductors. The first and second conductors may be formed in a layer beneath the magnetoresistive element and connected thereto by metallic vias.

In a number of embodiments, the sensor further comprises an insulating layer formed over the magnetoresistive element. The insulating layer may be formed of a polyimide. Other insulators can be used.

In some embodiments, the shorting bars are substantially parallel to one another and are approximately equally spaced apart throughout the region beneath the magnetoresistive element, or at least a first sensing region thereof.

According to certain embodiments, a magnetization vector $\overline{M}$ of the magnetoresistive element is at an angle of between approximately 35° and 55° to a longitudinal axis of an individual one of the shorting bars, and preferably, at an angle of 45°. These angles can substantially maximize the linearity of operation of the sensor. Put another way, the shorting bars are angled with respect to the magnetically easy axis of the magnetoresistive element.

In one embodiment, the shorting bars are made of tungsten. Tungsten provides high conductivity. Alternatively, the shorting bars may be made of another metal such as copper, aluminum, or alloys thereof. Similarly, the vias connecting the magnetoresistive element to other conductors may be formed of Tungsten and/or another metal, such as copper or aluminum.

The magnetic sensor may further comprise a flipping coil arranged to provide an electrically controlled magnetic field to the magnetoresistive element. The magnetic field from the flipping coil may be used to realign the magnetization vector of the magnetoresistive element in order to reduce offset and increase sensitivity of the magnetic sensor. The magnetic field from the flipping coil can also allow the sensor to be used in a mode where the external magnetic filed is sequentially additive and subtractive with respect to the magnetic field generated at a known switching rate by the flipping coil. Hence, signal processing techniques can extract the influence of the external magnetic field from background noise.

It is thus possible to provide a sensor which, if the orientation of the sensor with respect to an external field is known, can measure the strength of the magnetic field. Such a sensor can be useful in current measuring devices. If more than one sensor is used, and/or the strength of the magnetic field is known, it is possible to measure the direction of the magnetic field with respect to the sensor. The sensor can be used in, for example, a magnetic compass.

According to a second aspect of the disclosure there is provided a monolithic integrated circuit comprising a sensor of the first aspect of the disclosure.

Accordingly, signal processing components or other components can be manufactured with sensors in the integrated circuit. In some embodiments, one or more circuits may be integrated with the magnetic sensor to process signals from the magnetoresistive element and/or to control the flipping coil.

According to a third aspect of the disclosure there is provided a method of manufacture of a sensor, the method comprising, in a first fabrication facility, forming one or more components of the sensor on a substrate; and in a second fabrication facility depositing a sensor layer onto the substrate or over the one or more components. For example, a first fabrication facility can form one or more components of the sensor, excluding the sensor layer, on the substrate and then the substrate can be shipped to the second fabrication facility. The substrate with the sensor partially formed thereon can be received at the second fabrication facility, and the sensor layer can be deposited over the one or more components in the second fabrication facility.

This is advantageous because the sensor element, such as a magnetoresistive layer, is deposited in the latter stages of production of the device. Consequently, some or all process steps preceding deposition of the magnetoresistive layer can be performed in a fabrication facility which will not be exposed to the materials used to form the sensor layer. These processes may include the formation of shorting bars beneath the sensor layer, where the sensor layer is a magnetoresistive layer. These processes may also include steps for the manufacture of semiconductor devices (e.g., transistors) or other components by patterning, etching, doping, deposition of layers, thermal diffusion and so on. Because the sensor layer is deposited in the latter processing steps during fabrication, complex components such as integrated circuits may be fabricated on the same semiconductor wafer as the sensor. High temperature diffusion and annealing steps used in the production of transistors may adversely affect the quality or operation of the sensor material. Since the transistors and associated devices can be fabricated before deposition of the sensor layer, the sensor can avoid exposure to such high temperature processing steps.

According to certain embodiments, the method further comprises forming a flipping coil beneath where the sensor layer forms the sensor element and providing first and second conductors in electrical connection with a first end and a second end of the flipping coil.

In a number of embodiments, the plurality of shorting bars are made of tungsten and are formed using at least one of chemical mechanical polishing (CMP) and etch back processes.

According to a fourth aspect of the disclosure there is provided a method of manufacture of a sensor having a thin film sensor layer, the method comprising, in a first fabrication facility, forming one or more components of the sensor on a substrate except the sensor layer.

The sensor may then be sent to a second fabrication facility where a step of depositing a sensor layer onto the one or more components is performed.

According to a fifth aspect of the disclosure there is provided a method of manufacture of a sensor, the method comprising receiving at a second fabrication facility a sensor comprised of one or more components of the sensor except a sensor layer on a substrate, and at the second fabrication facility depositing a sensor layer over the one or more components.

According to a sixth aspect of the present disclosure there is provided an integrated circuit, comprising:
 a substrate;
 a metallic layer patterned so as to form a plurality of conductive tracks for interconnecting circuit elements;
 a thin film element; and
 an insulating layer between the metallic layer and the thin film element, where connections between the thin film element and selected ones of the conductive tracks are made via metallic interconnectors extending though the insulating layer so as to connect the thin film element to other circuit components, the thin film element being positioned over the metallic interconnectors.

It is thus possible to provide a standardized metallic interconnector that facilitates relatively easy connection to the sensor materials.

BRIEF DESCRIPTION OF THE FIGURES

Embodiments of the invention will now be described, by way of example only, with reference to the accompanying drawings, in which:

FIGS. 7a to 7i are cross-sectional views illustrating the manufacturing stages of a sensor according to an embodiment.

DETAILED DESCRIPTION OF CERTAIN EMBODIMENTS

As used herein, terms such as "above," "on," "beneath" and so on refer to structures oriented as shown in the figures, unless context clearly indicates to the contrary.

Figure 1:
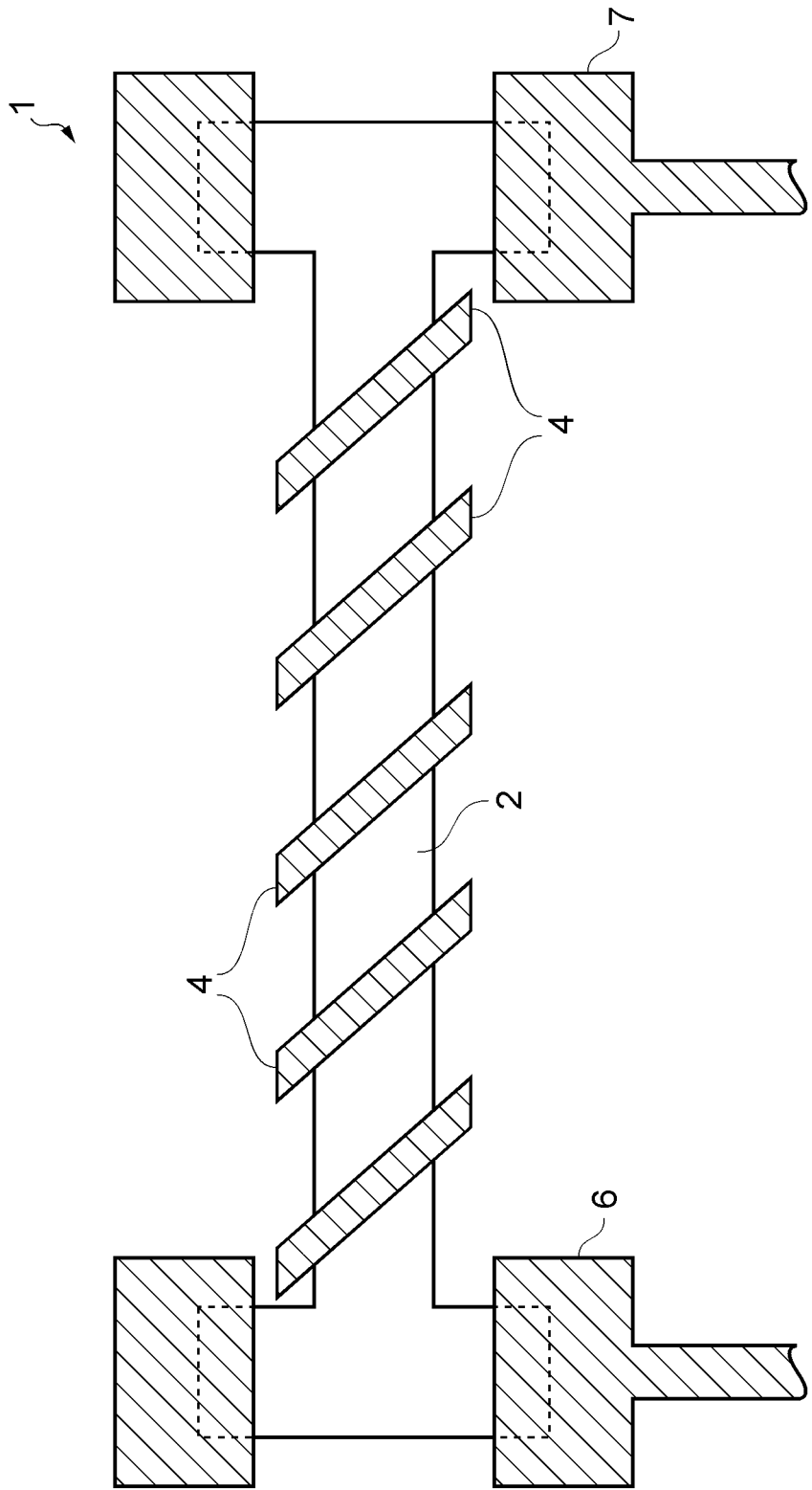
FIG. 1 is a schematic plan view of a known magnetoresistive sensor with shorting bars disposed over the magnetoresistive element.
Figure 2:
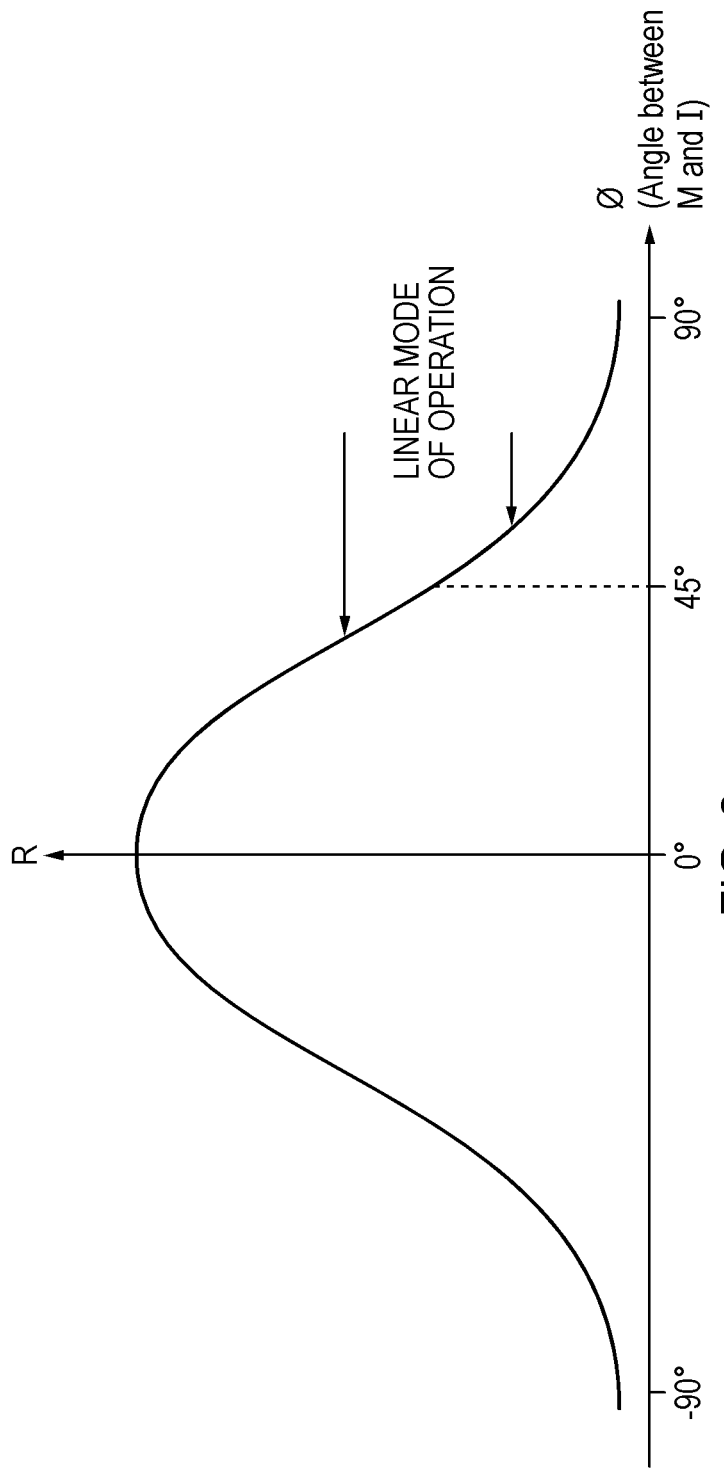
FIG. 2 is a graphical illustration of the relationship between magnetoresistance and angle between the magnetization vector and current in the magnetoresistive element shown in FIG. 1.

As discussed hereinabove, known anisotropic magnetoresistive (AMR) sensors include a film of a magnetoresistive material, typically Permalloy (NiFe), deposited onto a semiconductor substrate. A prior art sensor, generally designated 1, is shown in FIG. 1. The magnetoresistive film is patterned on the substrate to form a magnetoresistive element 2 having a longitudinal axis. The magnetoresistive element 2 serves as a resistive sensing element. Permalloy's magnetoresistive properties allow for the resistance of the magnetoresistive element 2 to alter by between approximately 2% and 3% in the presence of a magnetic field. The preferred orientation of magnetization $\overline{M}$ of the permalloy can be set during fabrication so that it runs parallel to the longitudinal axis of the sensing element 2. The electrical resistance R of the sensing element 2 depends upon an angle θ between a direction of flow of electric current I and orientation of a magnetization vector $\overline{M}$ within the magnetoresistive element 2, for example, as shown in FIG. 2. The resistance R of Permalloy is at its maximum when the current flow I is parallel to the magnetization vector $\overline{M}$, and at its minimum when the current is perpendicular to the magnetization vector $\overline{M}$. This is schematically illustrated in FIG. 2 where the origin of the resistance axis has been suppressed so as to highlight the change in resistance R as a function of angle θ.

So that the sensor can operate in a substantially linear mode (as illustrated in FIG. 1), metal strips, which can be referred to as shorting bars 4 or barber poles, are deposited on top of and in contact with the Permalloy resistive strip of the magnetoresistive element 2, generally at a 45° angle with respect to the longitudinal axis of the magnetoresistive element 2, as shown in FIG. 1. Contacts 6 and 7 are formed at either end of the element 2 in the same plane as the shorting bars 4. Since the shorting bars 4 have a much higher conductivity than the Permalloy magnetoresistive element 2, the shorting bars 4 rotate the current direction in the magnetoresistive element 2 to substantially 45° in relation to the longitudinal axis of the element 2. An external magnetic field H applied to the sensor 1 causes the direction of the magnetization vector $\overline{M}$ to change, and hence change the resistance of the sensor 1. Accordingly, the relative orientation and/or magnitude of a magnetic field with respect to the sensor 1 can be measured. Conventionally the deposition of the magnetic material and the conductive material forming the shorting bars 4, and the patterning thereof, are all performed on the substrate in the same fabrication facility.

As mentioned above, due to the presence of Permalloy or other materials that are normally considered to be contaminants in the fabrication process, the device is manufactured in a "dirty fab" facility. Machinery and processes available are limited to those present in dirty fab facilities, which are typically out of date relative to those found in "standard" or more contemporary fabrication facilities. The huge cost of establishing a new semiconductor fabrication facility makes it uneconomical to build one for the manufacture of sensor devices when such a facility will be unavailable for use in the manufacture of other integrated circuits due to the presence of the contaminant materials. Presently available AMR sensor technology therefore suffers such that downscaling of device dimensions and increases in performance is not typically kept in line with prevailing integrated circuit manufacturing trends.

Figure 3:
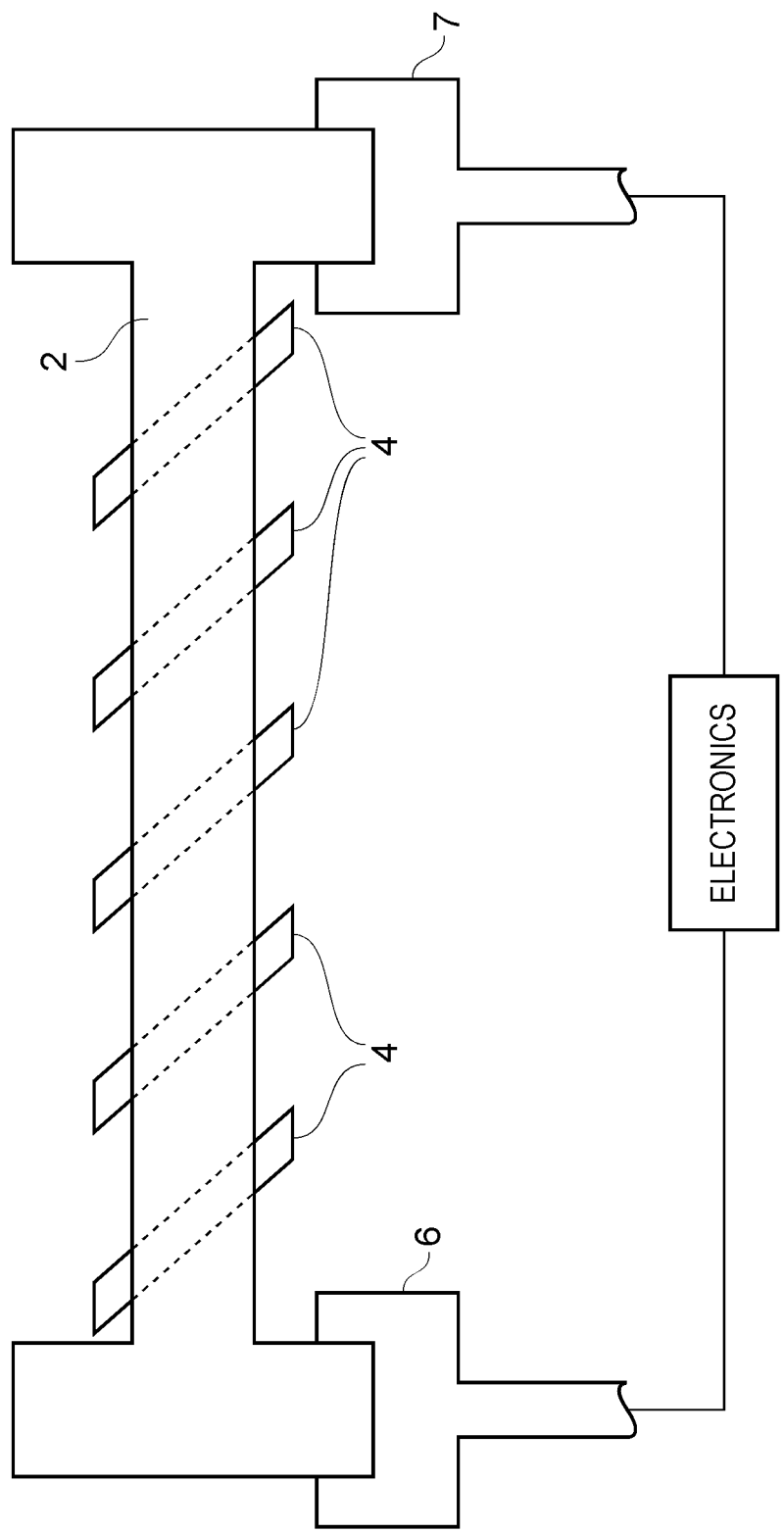
FIG. 3 is a plan view of a magnetic sensor in accordance with an embodiment.

FIG. 3 shows a plan view of a magnetic sensor in accordance with an embodiment. As illustrated, the thin film of Permalloy that forms the sensing element 2 is positioned over the shorting bars 4. The positioning of the shorting bars 4 illustrated in FIG. 3 is contrary to the perceived wisdom and technical prejudice of the person skilled in the art of manufacturing anisotropic magnetoresistive sensors. Deposition of the Permalloy layer is performed very late in the manufacturing process. Accordingly, all processing steps leading up to the deposition of the Permalloy, including forming the shorting bars 4, depositing dielectric layers and even fabrication of integrated circuits 5 (such as analog-to-digital converters, digital signal processors, current supplies, or the like) for a flipping coil and associated controllers on the same wafer may be performed in a first fabrication facility that is kept "clean", i.e., not used to deposit the sensor layer and therefore does not process the materials used to form the magnetoresistive sensing element 2. The device can then be moved into a second, dirty facility for deposition of the sensing element 2.

Figure 4:
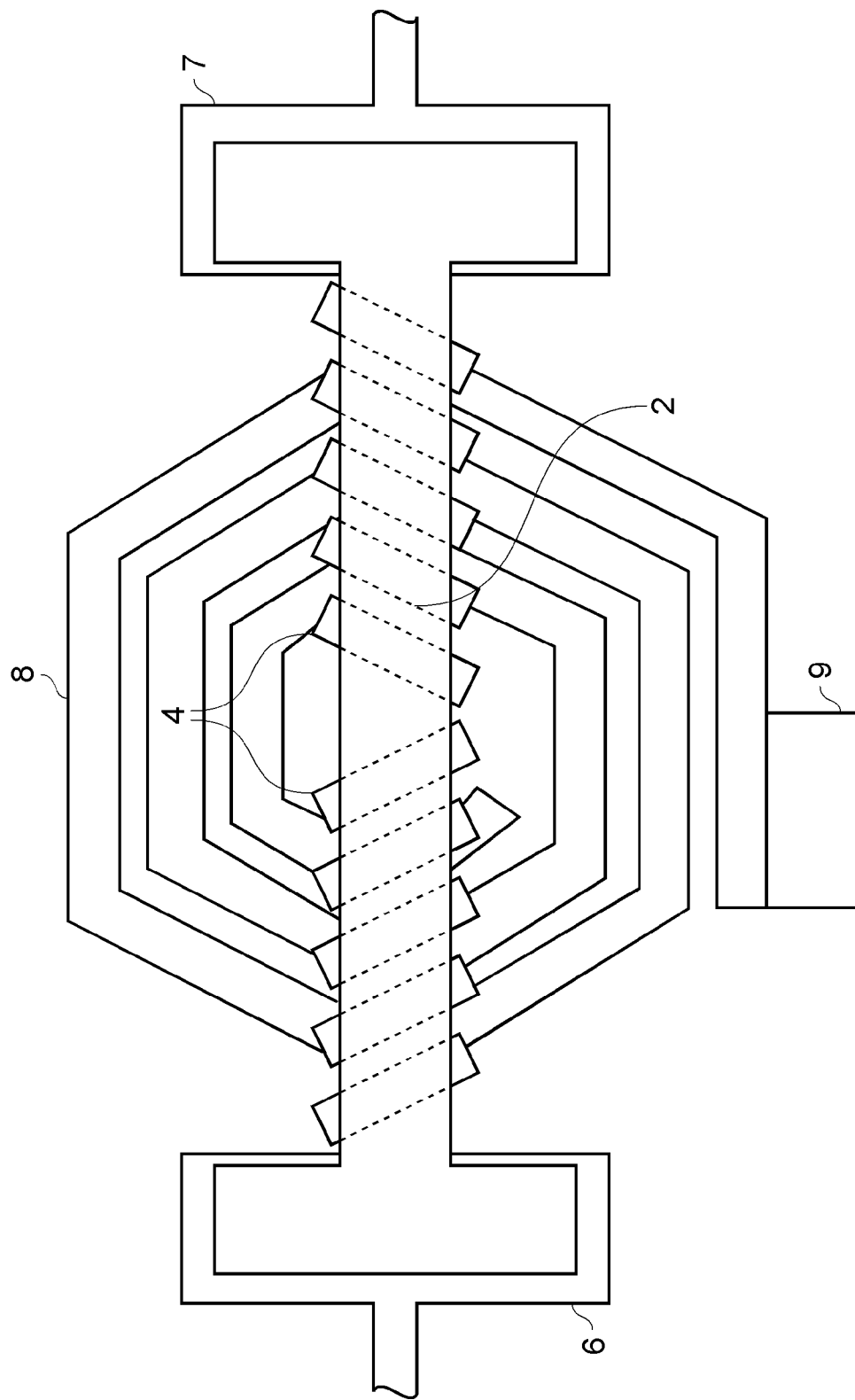
FIG. 4 is a plan view of a magnetic sensor with a flipping coil disposed beneath the sensing element of the magnetic sensor in accordance with an embodiment.

As noted before, the sensor is generally provided with a coil 8, which can be referred to as a "flipping coil." The coil 8 can be associated with, and generally fabricated beneath the sensing element 2. Such an arrangement is schematically illustrated in FIG. 4. It will be appreciated that in a finished device an insulating layer is formed over the flipping coil 8 to stop the coil 8 from shorting out with the sensing element 2 and/or shorting bars 4. The insulating layer may be a dielectric layer, such as of silicon dioxide. The flipping coil 8 typically has bond pads 9 (of which only one is shown for illustrative purposes) formed at either end of the conductive track that forms the coil 8, to allow current flow connections to be made to the coil 8. Also, because in this example the flipping coil 8 is concentrically disposed with the magnetoresistive element 2, then the direction of the shorting bars 4 is reversed on one half of the sensor compared to the other half to account for the reversed direction of the magnetic field from the flipping coil 8. If the coil 8 were disposed to one side of the magnetoresistive element 2, then all the shorting bars 4 could remain in the same orientation, for example, as shown in FIG. 3.

Figure 5:
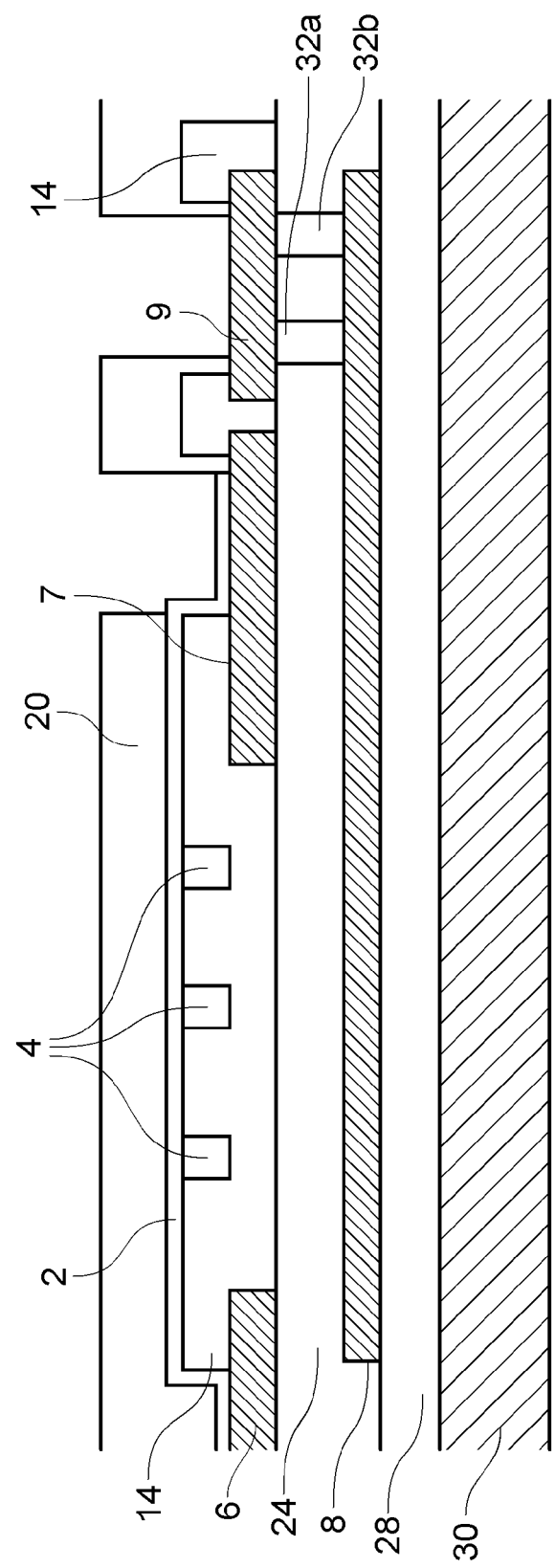
FIG. 5 is a cross section through the sensor shown in FIG. 4.

FIG. 5 is a cross-sectional view of the magnetic sensor shown in FIG. 4. Shorting bars 4 can be embedded or inset into a first dielectric layer 14, which may be provided over a semiconductor substrate 30. As illustrated, the first dielectric layer 14 can be provided over a second dielectric layer 24. The shorting bars 4 are substantially fully inset into the first dielectric layer 14.

Any suitable number of shorting bars 4 may be disposed in the dielectric layer 14. The number of shorting bars 4 may depend upon several parameters, such as, but not restricted to, the magnetoresistive material used in the sensor, the size of the device, and the magnetic sensitivity required. The level of accuracy of the positioning will depend on the technology utilized during manufacture. Since manufacture of the shorting bars may be performed in a "standard" fabrication facility, an advantage of the manufacturing process described herein can be that shorting bars 4 may be fabricated with high density and small feature size due to the higher standard (resolution) of apparatus available, resulting in improved performance of magnetoresistive sensors compared to an equivalent magnetoresistive sensor fabricated in a "dirty fab" having older equipment therein operating with a larger minimum feature size.

The shorting bars 4, or at least groups of shorting bars 4, are substantially parallel relative to one another and positioned at approximately equidistant intervals along the magnetoresistive element 2 to distribute current evenly along the device and hence improve the linearity of operation.

Advantageously, the dielectric layer 14 can include a silicon nitride layer ($Si_3N_4$) to provide a smooth surface and hence a well controlled profile of the underside of the sensor element 2 disposed thereon. The dielectric layer 14 could alternatively be made of $SiO_2$ or any other suitable dielectric material.

Electrical connectors 6 and 7, which may be provided as enlarged pads (bond pads) at an end of a conductive track, can also be positioned on the substrate 30, as shown. Alternatively, the electrical connections can be embedded in the second dielectric layer 24. The electrical connectors 6 and 7 connect first and second opposing ends of the magnetoresistive element 2 to external nodes (not shown).

Figure 6:
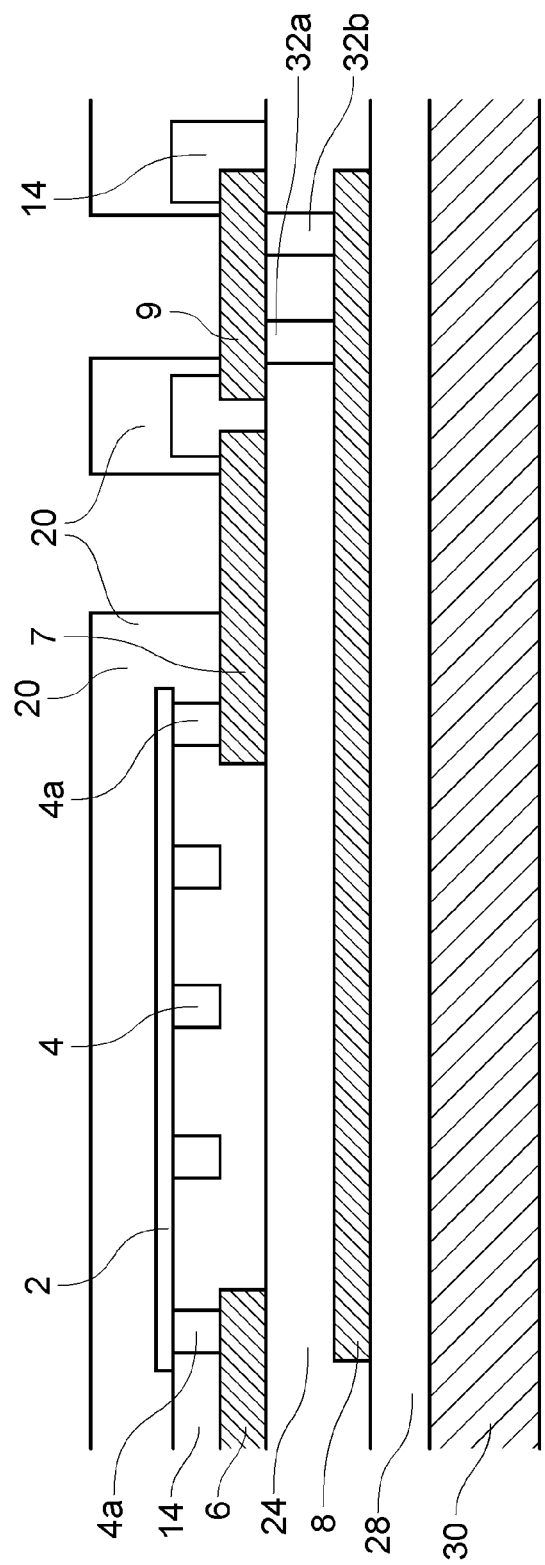
FIG. 6 is a cross section through a sensor in accordance with another embodiment.

Alternatively, as shown in FIG. 6, one or more of the shorting bars 4 may be deposited in the dielectric layer 14 at a position such that a selected shorting bar 4*a* is in current flow connection with an associated connector 6 or 7 and functions as a via. In such a case, during operation, current flows through one of the connectors 6, 7, the selected shorting bar 4*a* (acting as a via) and into (or from) the magnetoresistive element 2.

As illustrated, the magnetoresistive element 2 is positioned over the first dielectric layer 14 and the inset shorting bars 4. The sensor element 2 can be deposited via sputtering or e-beam evaporation in a magnetic field. The magnetoresistive element 2 may be deposited in a thin strip as shown in FIG. 3, or in more complex designs may be provided as a thin strip (i.e. it has a width much smaller that its length) provided in a meandering path, such that different sections of the strip form different sensors within a bridge of sensors.

The material of the magnetoresistive element 2 can be a Permalloy thin film material with approximately 19%-21% Iron and approximately 79%-81% Nickel. However, other magnetoresistive materials are available and may alternatively be used.

A further layer 20, such as a polyimide, may then be deposited over the magnetoresistive element 2 to protect it.

The magnetization vector $\overline{M}$ of the magnetoresistive element 2 may be preset during manufacturing to be substantially parallel to the longitudinal axis of the element.

The orientation of the $\overline{M}$ vector may be disturbed during operation due to temperature fluctuations, material impurities, imperfections in the sensor element 2 and/or simple exposure of the magnetoresistive layer to high external fields. To counter such variation, a flipping coil 8 may integrated into the semiconductor substrate 30.

As shown in FIGS. 4 to 6, a flipping coil 8 may be disposed underneath the first dielectric layer 14 and separated from the connectors 6 and 7 by the second dielectric layer 24. One or more conductors 32*a* and 32*b* disposed in the dielectric layer 24 can electrically connect flipping coil 8 to a bond pad 9, which may be connected to an external node. Other connections can be made to the flipping coil 8 so as to allow current to be passed through the coils 8, but are omitted in FIGS. 5 and 6 for illustrative purposes. The flipping coil 8 can be made of a thin film of aluminum and/or titanium, or any other suitable conductive material.

In use, a current can be passed through the flipping coil 8 to provide a non-permanent magnetic field, which saturates the magnetoresistive element 2 and realigns the magnetization vector $\overline{M}$. Periodic flipping of the magnetization vector $\overline{M}$ using a flipping coil 8 can decrease offset and increase sensitivity of the device as known to a person skilled in the art. Electrically induced magnetic fields of reduced strength can be used to provide known time varying contributions to the magnetic field around the magnetoresistive strip to enable boxcar/lock-in type signal processing operations to facilitate measurement of weak magnetic fields and use of AC coupled signal processing.

The flipping coil 8 is, in this example embodiment, disposed on the third dielectric layer 28, which is provided over the semiconductor substrate 30.

FIGS. 7*a* to 7*i* show cross sections corresponding to various stages of manufacture of a sensor shown in FIG. 6. Although these figures show one particular structural configuration, the invention is not limited to this and some layers may be omitted or replaced with alternative or similar layers and materials.

Figure 7A:
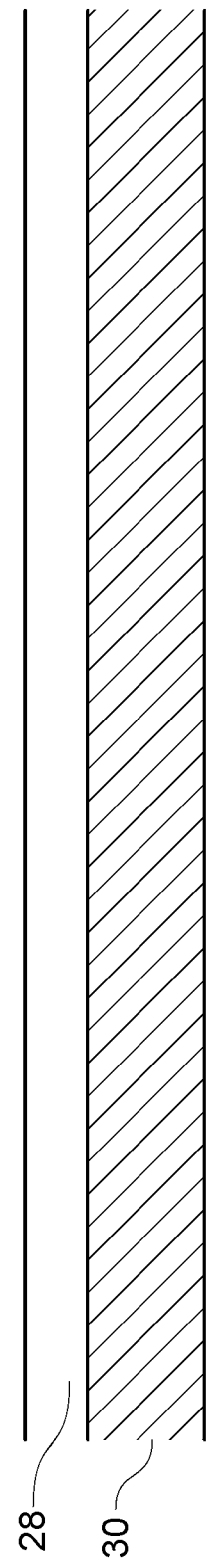

In this example, the third dielectric layer 28 is formed on the semiconductor substrate 30 as shown in FIG. 7*a*. The substrate 30 can be silicon or other suitable semiconducting substrate materials. Integrated circuit devices, such as transistors, may be formed elsewhere in the substrate.

The third dielectric layer 28 and other dielectric layers mentioned herein can be formed of silicon dioxide or silicon nitride and may be formed via thermal oxidation/nitridation, chemical vapor deposition (CVD), physical vapor deposition (PVD) or any other suitable method.

In embodiments where a flipping coil 8 is incorporated into the device, a conducting layer, for example, Aluminum can be deposited onto the surface of dielectric layer 28, as shown in FIG. 7*b*, and then selectively etched to leave a spiral conductive track, which forms a planar flipping coil 8 on the substrate 30 as schematically shown in FIG. 4.

Figure 7C:
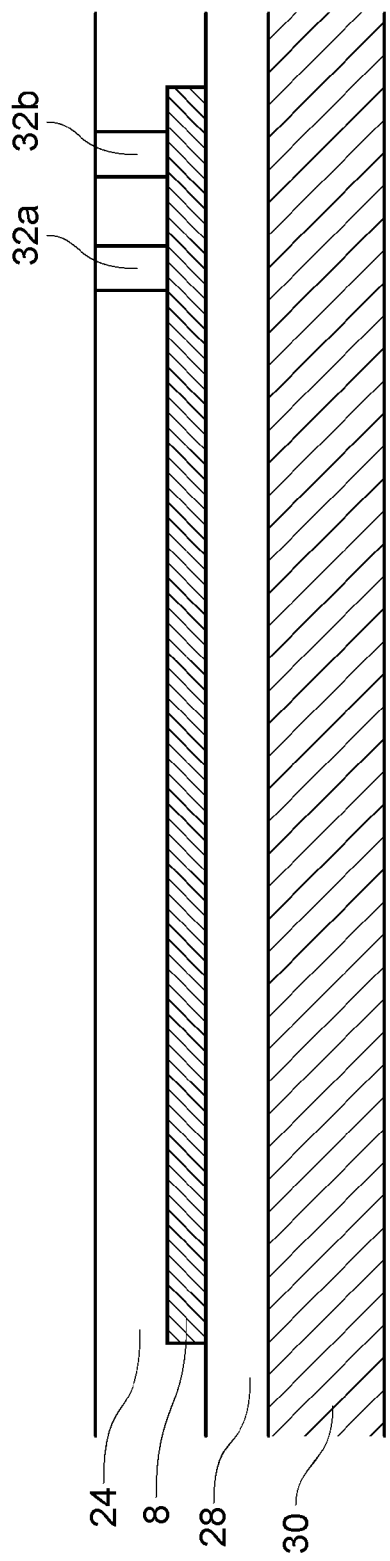

The second dielectric layer 24 can then be deposited on top of the flipping coil 8, as shown in FIG. 7*c*. One or more trenches or apertures may then be etched into the second dielectric layer 24 and filled with metal to form conductors 32*a*, 32*b*. The conductors 32*a*, 32*b* provide a path for current to flow to the flipping coil 8 from the bond pad 9. A similar connection (not shown) may be made to the other end of the spiral track that forms the flipping coil 8.

Figure 7D:
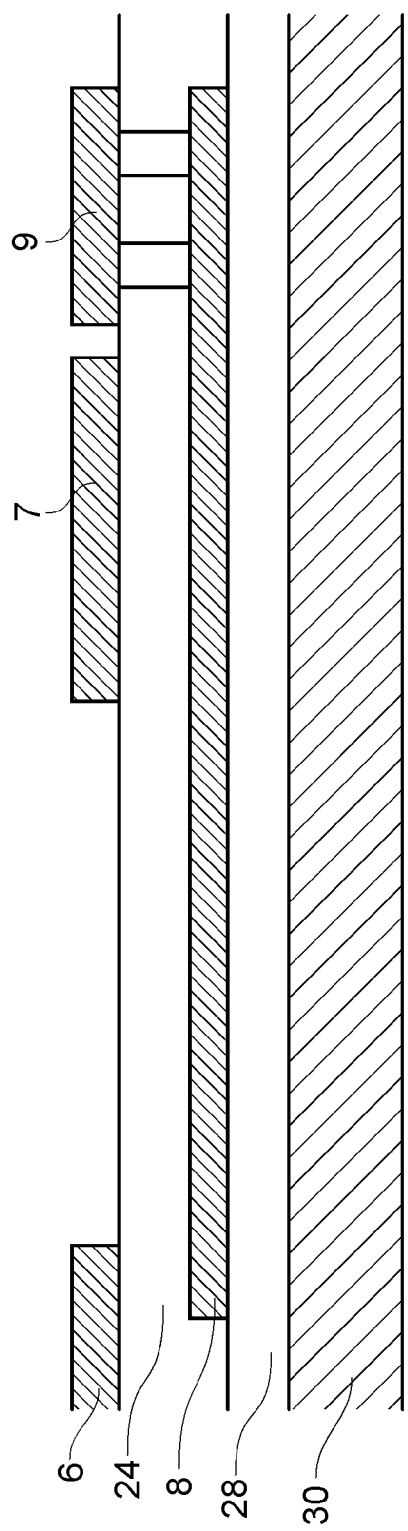
Figure 7E:
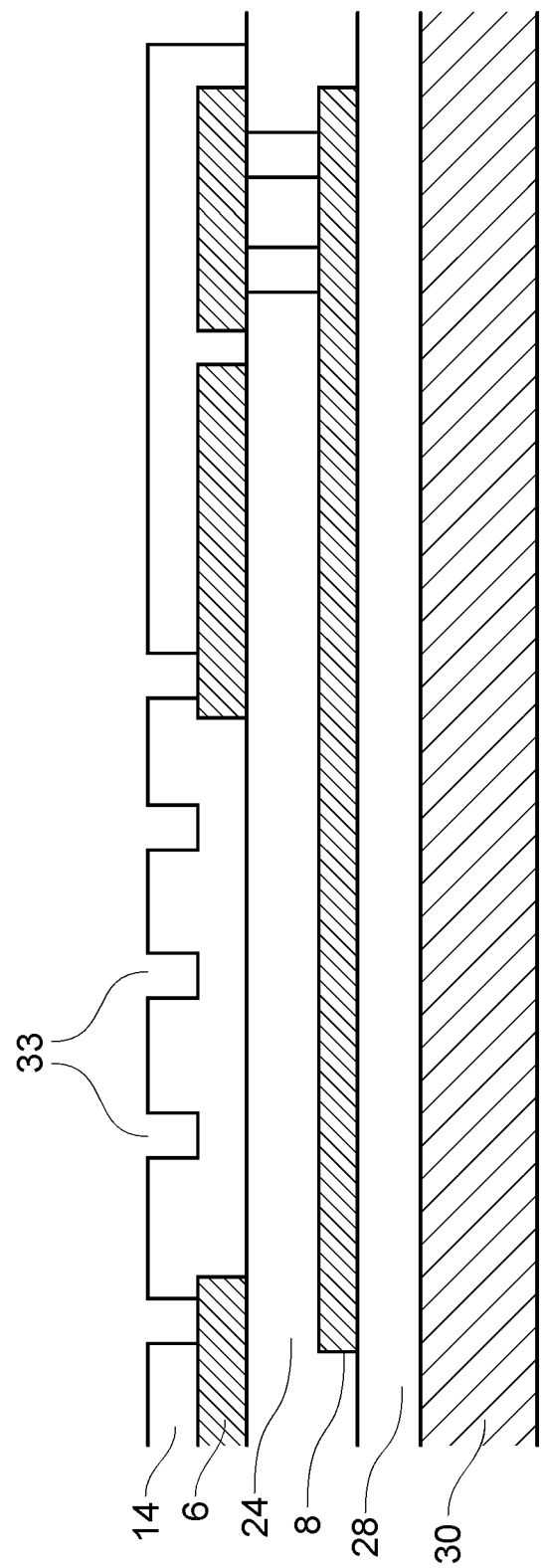
Figure 7F:
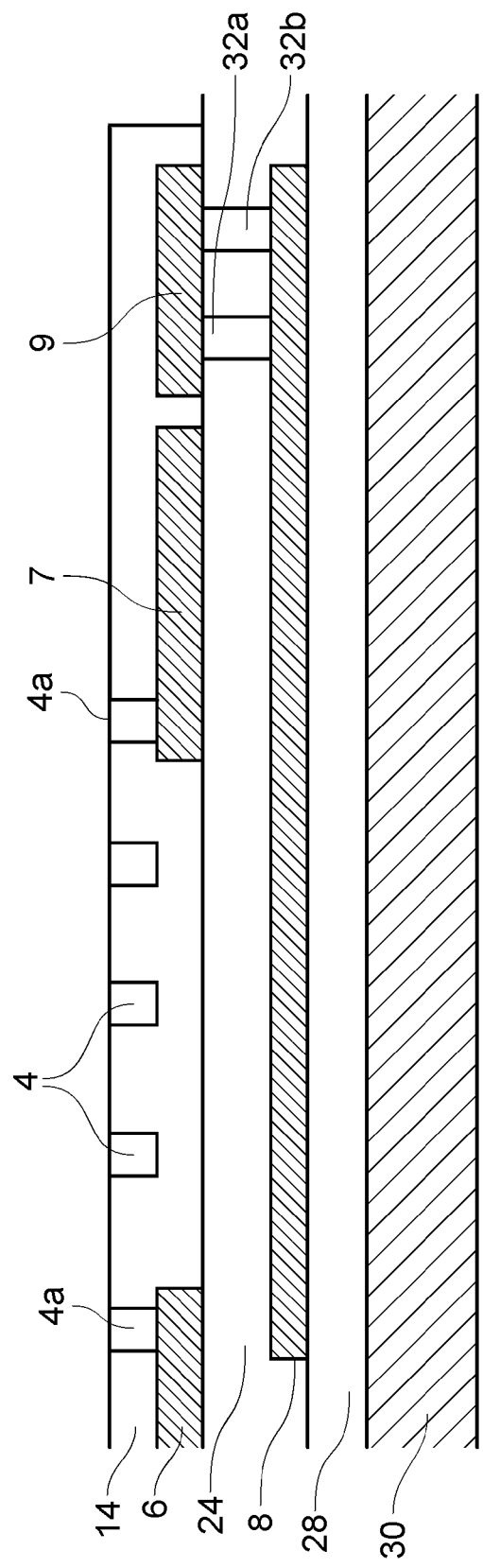

As shown in FIG. 7*d*, a conducting layer can be deposited on dielectric layer 24 and etched to form connectors or bond pads 6, 7 and 9 arranged to connect either end of magnetic sensing element 2 and the flipping coil 8 to external nodes or other circuits on or in the semiconductor substrate 30. The bond pads 6, 7, and 9 can be formed of aluminum, titanium, the like, or any combination thereof. The first dielectric layer 14, for example, of silicon nitride, can then be deposited on top of the structure, as shown in FIG. 7e. Next an anisotropic etch can be performed to create a series of trenches 33 in which the shorting bars (barber poles and vias) will be formed, also as shown in FIG. 7e. Then, as shown in FIG. 7f, a conducting layer can be deposited onto dielectric layer 14 to fill in the trenches 33 and form the shorting bars 4 and vias 4a. The conducting layer may be made out of any non-ferrous metal, for example Aluminum or Titanium. Tungsten can be used for its high conductivity.

In embodiments where the flipping coil 8 is not incorporated into the magnetic sensor device, the operations depicted in FIGS. 7b to 7c describing the formation of flipping coil 8, dielectric layer 24 and conductors 32a and 32b may be omitted from the manufacturing process. In such a case, the conducting layer forming bond pads 6, 7 and 9 may be deposited directly onto the third dielectric layer 28.

The conductive layer that forms the shorting bars 4 can be deposited using physical vapor deposition or any other suitable process. The top of the conductive layer may then be removed using any suitable etch-back or planarizing process, such as a reactive ion etch (RIE), chemical mechanical polishing (CMP) or a combination thereof. One advantage of the manufacturing processes described herein can be that chemical mechanical polishing, which would generally not be available in "dirty" facilities, can now be used in the manufacture of magnetoresistive sensors, enabling the formation of metal shorting bars in dielectric trenches. Chemical mechanical polishing or other etch back techniques removes metallic deposits over the first dielectric layer 14 leaving shorting bars 4 and vias 4a inset into the first dielectric layer 14.

In conventional manufacturing in a "dirty fab," the shorting bars have been formed using a metal deposition and a chemical etch, and are limited in feature size and accuracy by the etch process. An advantage of the manufacturing process described herein is therefore that advanced processing techniques, such as the illustrated damascene processing, permits scaling of the shorting bar dimensions. Accordingly, narrower shorting bars 4 may be realized, increasing sensitivity and reducing feature dimensions.

Figure 7G:
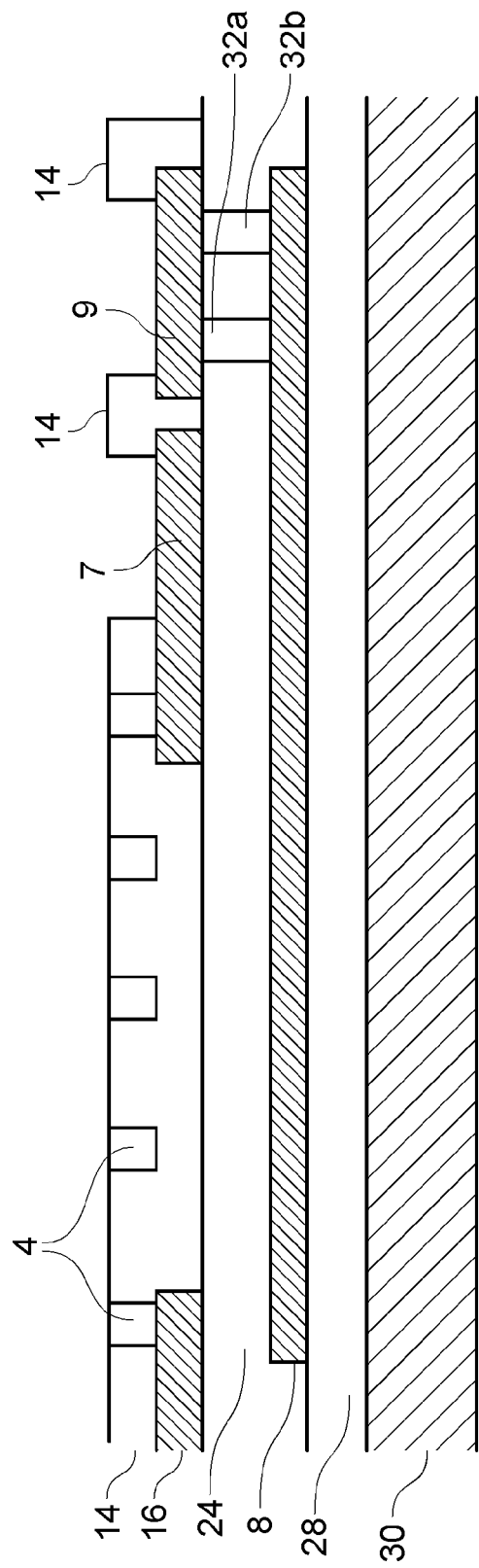

Once the conductive layer has been etched back to form the inset shorting bars 4, the first dielectric layer 14 may be patterned expose the bond pads 7 and 9 as shown in FIG. 7g.

The above processing steps can all be conducted within a high precision and "clean" fabrication facility, such as one in which no Permalloy processing is conducted.

At this point, depositing the magnetoresistive thin film layer 2 can be done in a different fabrication facility. Although not shown in the accompanying figures, any number of processes available for integrated circuit fabrication may be undertaken at any stage before deposition of the layer forming the magnetoresistive element 2. Hence, a benefit of such processing is that complex integrated circuitry can be fabricated in a "clean fab" on the same wafer as the magnetic sensor.

Figure 7H:
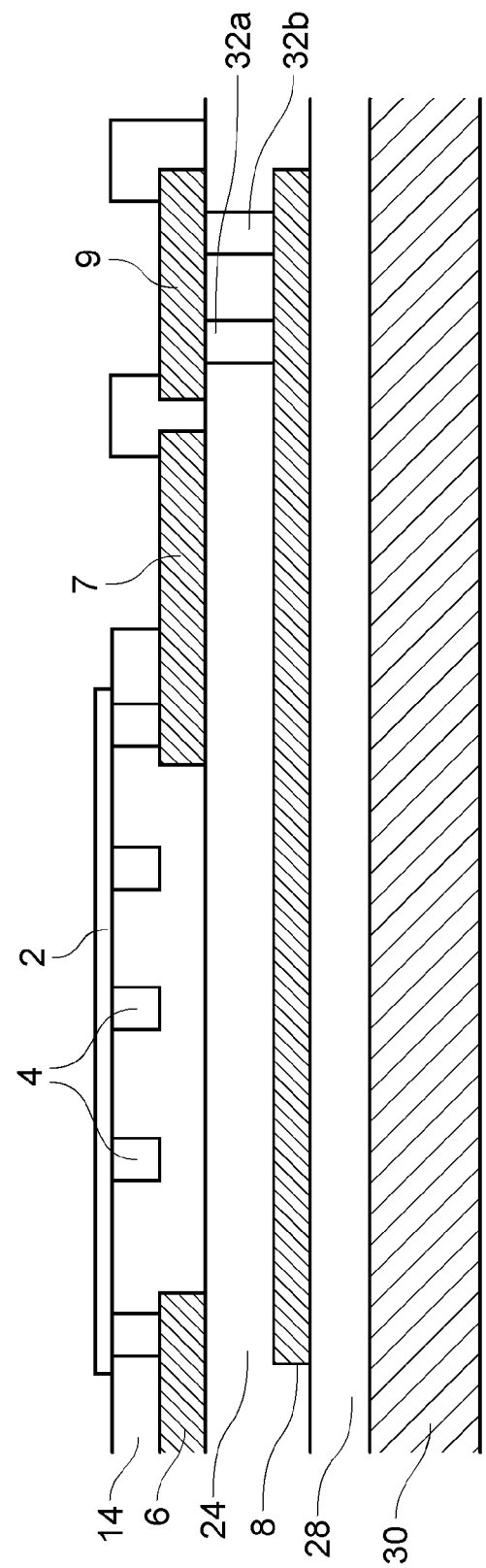

The Permalloy free wafer can be transferred to a "dirty" fabrication facility. The magnetoresistive material can then be deposited by way of, for example, a sputtering or e-beam evaporation process in the presence of a magnetic field to set the preferred direction of the magnetization vector $\overline{M}$, and etched back to form the magnetoresistive layer 10 over the shorting bars 4, as shown in FIG. 7h. The magnetoresistive layer 2 can be etched into a thin strip, an example of which can be seen in FIGS. 3 and 4. In the illustrated embodiment, the shorting bars 4, which may comprise titanium, do not extend through the insulator 14 to contact an underlying metallic conductor in an intermediate portion of the sensor 2 between its current flow contacts.

Permalloy (NiFe) can be used for the magnetoresistive element 2 due to its high magnetic permeability, low coercivity, low magnetostriction and reasonable magnetoresistance. Any other material displaying suitable sensing properties could alternatively or additionally be used.

Figure 7I:
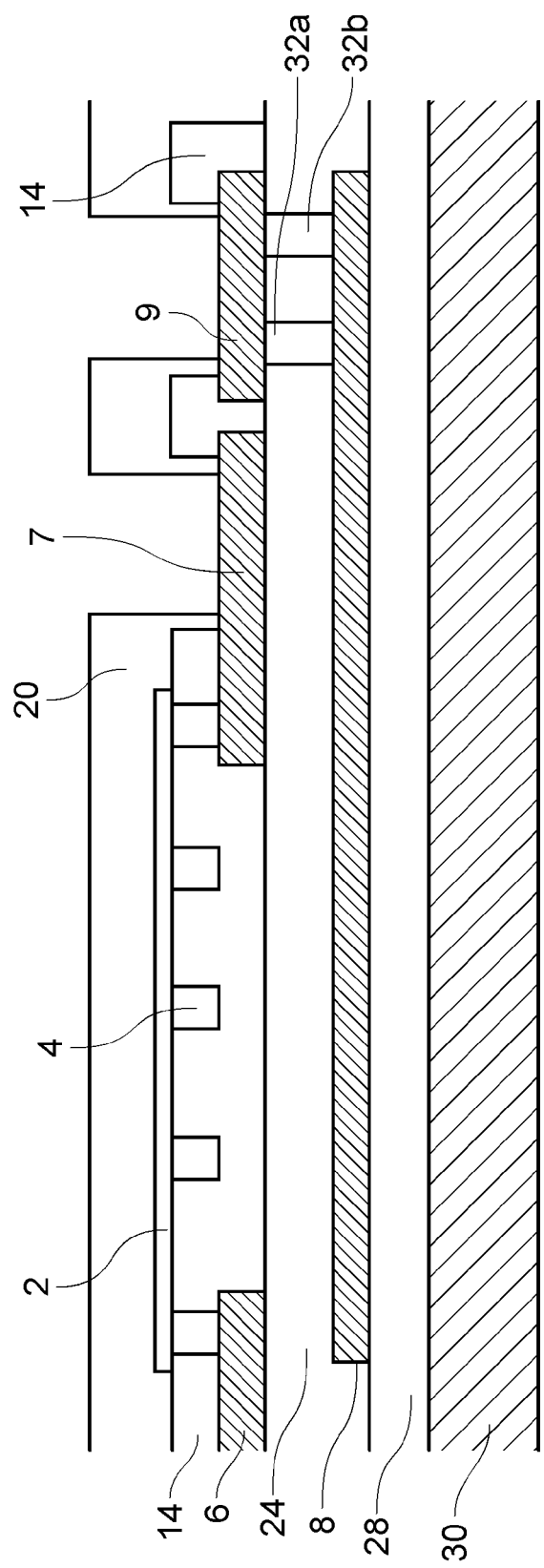

As shown in FIG. 7i, a protective layer, such as a polyimide layer 20, can be deposited and patterned over the structure to provide environmental protection and leave the bond pads 7, 9 open, or the bond pads could later be opened during a separate packaging process.

It is thus possible to segregate the manufacturing process between two fabrication facilities. The first manufacturing facility can provide enhanced precision in the formation of features, such as the shorting bars 4, whereas the second manufacturing facility may have less sophisticated equipment therein and can deposit the sensor material and, if desired, an environmental sealing layer.

Although the invention has been described in the context of a sensor where the thin film that forms the sensor exhibits magnetoresistance, other films could be used to form other sensors. Thus one or more films could be deposited to form a temperature sensor (thermo-couple) or an energy harvesting device. In the energy harvesting device, a change storage device, such as a capacitive storage device and/or a unidirectional current flow circuit or device, such as a diode, can be included.

Figure 8:
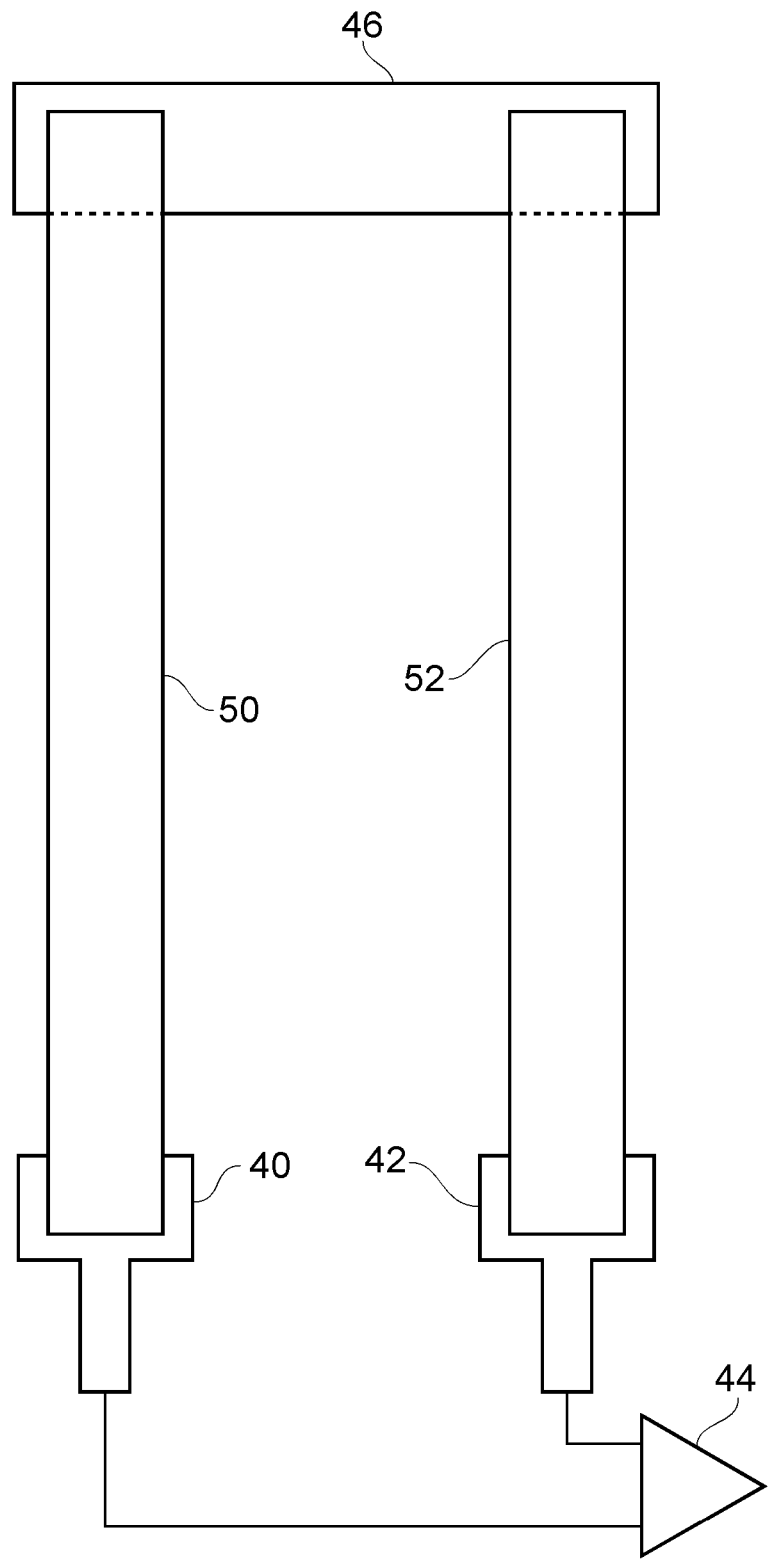
FIG. 8 is a plan view of a thermocouple in accordance with an embodiment.

FIG. 8 schematically shows a thermocouple in which contacts 40 and 42 may be formed in a first fabrication facility to make current flow connection to first and second thermocouple elements 50 and 52 which may be deposited over the contacts 40 and 42 at a later stage in production of an integrated circuit containing the thermocouple. The contacts may be in connection with an operational amplifier 44. A further contact 46 is also deposited on a substrate in the first fabrication facility so as to form a joining node between the thermocouple elements 50 and 52.

Contacts 40 and 42 are notionally close together, and at a first end of the thermocouple. Connector 46 is a second end of the thermocouple. Provided that a temperature difference exists between the first and second ends of the thermocouple, and that the thermocouple elements 50 and 52 have different Seebeck coefficients, then a voltage difference will be developed between contacts 40 and 42. The amplifier may be replaced by other circuits, for example for signal processing or energy harvesting.

The thermocouple elements may contain any suitable metal. Once of them may be Bismuth Telluride. The thermocouple elements are deposited quite late in the circuit fabrication and may deposited in a second fabrication facility.

The methods, systems, and/or apparatuses described herein can be implemented into various electronic devices. Examples of the electronic devices can include, but are not limited to, consumer electronic products, parts of the consumer electronic products, electronic test equipment, etc. Example consumer electronic products can include, but are not limited to, wireless devices, a mobile phone (for example, a smart phone with a camera), a computer monitor, a computer, a hand-held computer, a tablet computer, a personal digital assistant (PDA), a microwave, a refrigerator, a stereo system, a cassette recorder or player, a DVD player, a CD player, a digital video recorder (DVR), a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic device can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The words "coupled" or "connected", as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the Detailed Description using the singular or plural number may also include the plural or singular number, respectively. The words "or" in reference to a list of two or more items, is intended to cover all of the following interpretations of the word: any of the items in the list, all of the items in the list, and any combination of the items in the list.

The teachings herein can be applied to other systems, not necessarily the systems described above. The elements and acts of the various embodiments described above can be combined to provide further embodiments.

While certain embodiments have been described, these embodiments have been presented by way of example only, and are not intended to limit the scope of the disclosure. Indeed, the novel methods and systems described herein may be embodied in a variety of other forms. Furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure. Accordingly, the scope of the present inventions are defined only by reference to the appended claims.

The claims have been drafted for filing in the United States of America where singly dependent claims are favored. However, for other jurisdictions where multiply dependent claims are allowed, dependent claims of a given type are to be assumed to depend on all preceding claims of the same type and which ultimately depend from a shared independent claim, where this is clearly not technically feasible.

The invention claimed is:

1. A magnetoresistive sensor comprising:
   a substrate;
   a plurality of shorting bars; and
   at least one magnetoresistive element formed over the substrate and the plurality of shorting bars, the at least one magnetoresistive element directly abutting and in electrical contact with the shorting bars,
   wherein at least a portion of an insulating layer is disposed between at least one of the plurality of shorting bars and the substrate, and wherein the insulating layer electrically isolates the one of the plurality of shorting bars from all elements of the magnetoresistive sensor other than the at least one magnetoresistive element,
   wherein the at least one of the plurality of shorting bars is defined by a shape of a trench within the insulating layer.

2. The sensor as claimed in claim 1 wherein the at least one of the shorting bars are angled with respect to a magnetically easy axis of the at least one magnetoresistive element.

3. The sensor as claimed in claim 1 further comprising a protective layer formed above the magnetoresistive element.

4. The sensor as claimed in claim 1 wherein the shorting bars comprise tungsten.

5. The sensor as claimed in claim 1 wherein the magnetoresistive layer comprises Permalloy.

6. A semiconductor integrated circuit comprising a sensor as claimed in claim 1.

7. The sensor as claimed in claim 1 further comprising a plurality of connectors in a connection layer and configured to interconnect the at least one magnetoresistive element and at least one other circuit element, the connection layer being disposed between the substrate and the at least one magnetoresistive element, and the insulating layer further comprising an insulator disposed adjacent the shorting bars so as to prevent at least one of the shorting bars from directly making electrical contact with the connectors.

8. The sensor as claimed in claim 7, wherein another one of the shorting bars is configured to connect the at least one magnetoresistive sensor to a selected one or more of the connectors, the another one of the shorting bars comprising tungsten and extending through the insulating layer.

9. The sensor as claimed in claim 7 further comprising:
   a coil; and
   a second insulating layer configured to insulate the plurality of connectors from the coil.

10. The sensor as claimed in claim 9 further comprising a third insulating layer configured to insulate the coil from the substrate.

11. The sensor as claimed in claim 1 wherein the insulating layer is a single layer.

12. The sensor as claimed in claim 1 further comprising vias on opposing sides of and extending laterally beyond the plurality of shorting bars, wherein the vias extend through the insulating layer and electrically connect the magnetoresistive element and conductors arranged to provide electrical connections between the magnetoresistive element and one or more other circuit elements.

13. An integrated circuit, comprising:
   a substrate;
   a plurality of connectors for interconnecting circuit elements;
   a thin film element;
   an insulating layer between the connectors and the thin film element, where connections between the thin film element and selected ones of the connectors are made by vias extending though the insulating layer so as to connect the thin film element to other circuit components, the thin film element being positioned over the vias; and
   a plurality of shorting bars inset in the insulating layer, wherein the plurality of shorting bars are directly abutting and in electrical contact with the thin film element,
   wherein at least one of the plurality of shorting bars is defined by a shape of a trench within the insulating layer, and wherein the insulating layer isolates the at least one of the plurality of shorting bars from all elements of the integrated circuit other than the thin film element.

14. The integrated circuit as claimed in claim 13 wherein the thin film element has magnetoresistive properties.

15. The integrated circuit as claimed in claim 13 wherein the thin film element is a thin film resistor.

16. The integrated circuit as claimed in claim 13 wherein the insulating layer is a single layer.

17. A magnetoresistive sensor comprising:

shorting bars;

vias including a first via and a second via, the first via being on a first side of the shorting bars and the second via on a second side of the shorting bars, the first and second sides opposing each other;

a plurality of connectors for interconnecting circuit elements;

a magnetoresistive element formed directly over the shorting bars and the vias; and an insulating layer disposed between the shorting bars and a substrate, wherein the shorting bars are inset in the insulating layer and the insulating layer electrically isolates the shorting bars from all elements of the magnetoresistive sensor except for the magnetoresistive element, wherein the first via and the second via extend through the insulating layer so as to connect the magnetoresistive element to one or more other circuit elements by way of the plurality of connectors, and wherein the inset shorting bars and the first via comprise a same material.

\* \* \* \* \*

UNITED STATES PATENT AND TRADEMARK OFFICE
CERTIFICATE OF CORRECTION

PATENT NO. : 9,817,087 B2  
APPLICATION NO. : 13/420389  
DATED : November 14, 2017  
INVENTOR(S) : Bernard Stenson et al.

Page 1 of 1

It is certified that error appears in the above-identified patent and that said Letters Patent is hereby corrected as shown below:

On the Title Page

Item (54), (Title) at Line 1, and in the Specification, in Column 1 at Line 1, change "MAGNETROESITIVE" to --MAGNETORESISTIVE--.

Signed and Sealed this  
Fifth Day of June, 2018

Andrei Iancu  
*Director of the United States Patent and Trademark Office*